US007843516B2

(12) United States Patent
Cernasov

(10) Patent No.: US 7,843,516 B2
(45) Date of Patent: Nov. 30, 2010

(54) LCD TOUCHSCREEN PANEL WITH SCANNING BACKLIGHT

(75) Inventor: Andrei Cernasov, Ringwood, NJ (US)

(73) Assignee: Honeywell International Inc., Morristown, NJ (US)

( * ) Notice: Subject to any disclaimer, the term of this patent is extended or adjusted under 35 U.S.C. 154(b) by 464 days.

(21) Appl. No.: 11/514,911

(22) Filed: Sep. 5, 2006

(65) Prior Publication Data

US 2008/0055494 A1    Mar. 6, 2008

(51) Int. Cl.
*G02F 1/1335*    (2006.01)
*G06F 3/042*    (2006.01)
*G06F 3/041*    (2006.01)
*G06K 11/06*    (2006.01)

(52) U.S. Cl. .................. 349/12; 345/173; 345/175; 178/18.09; 178/18.11

(58) Field of Classification Search .............. 349/12; 345/173–176; 178/18.09–18.11
See application file for complete search history.

(56) References Cited

U.S. PATENT DOCUMENTS

| | | | |
|---|---|---|---|
| 4,345,248 A * | 8/1982 | Togashi et al. ................ 345/90 |
| 4,855,590 A | 8/1989 | Bures et al. |
| 4,916,308 A | 4/1990 | Meadows |
| 5,105,185 A | 4/1992 | Nakanowatari et al. |
| 5,105,186 A | 4/1992 | May |
| 5,764,223 A | 6/1998 | Chang et al. |
| 6,630,928 B1 * | 10/2003 | McIntyre et al. ............ 345/173 |
| 6,864,882 B2 * | 3/2005 | Newton ..................... 345/173 |
| 6,943,779 B2 | 9/2005 | Satoh |
| 7,138,986 B2 * | 11/2006 | Ohtsuka ..................... 345/175 |
| 7,265,747 B2 * | 9/2007 | Martin ....................... 345/173 |
| 7,679,610 B2 | 3/2010 | Cernasov |
| 2001/0020578 A1 | 9/2001 | Baier |
| 2001/0050677 A1 | 12/2001 | Tosaya |
| 2003/0227446 A1 * | 12/2003 | Ohtsuka ..................... 345/173 |
| 2004/0140961 A1 | 7/2004 | Cok |
| 2005/0162381 A1 | 7/2005 | Bell et al. |
| 2006/0227120 A1 * | 10/2006 | Eikman ...................... 345/175 |
| 2008/0055261 A1 | 3/2008 | Cernasov |
| 2008/0055495 A1 | 3/2008 | Cernasov |
| 2008/0079687 A1 | 4/2008 | Cernasov |

OTHER PUBLICATIONS den Boer et al. "Active Matrix LCD with Intgrated Optical Touch Screen." SID '03 Digest, 2003.*

(Continued)

*Primary Examiner*—David Nelms
*Assistant Examiner*—Jessica M Merlin
(74) *Attorney, Agent, or Firm*—Ingrassia Fisher & Lorenz, P.C.

(57) ABSTRACT

A liquid crystal display (LCD) device (100) having an integrated touchscreen, includes a touchscreen surface and LC layer (20) that are partitioned according to the touchscreen keys (200). A corresponding probe light source (82) and sensor (92) positioned behind each partition is assigned to the corresponding touchscreen key. Each probe light sensor is configured to detect user contact on the touchscreen surface by sensing a reflection of the probe light. To further distinguish between different keys, each key may be made active according to a scanning or timesharing process. In this process, when a particular key is active, the neighboring keys are inactive. The scanning/timesharing process may be performed during a touchscreen mode of operation, which is interleaved with a normal display mode.

20 Claims, 13 Drawing Sheets

OTHER PUBLICATIONS

United States Patent And Trademark Office, Non-Final Office Action mailed Sep. 19, 2008 for U.S. Appl. No. 11/515,011, filed Sep. 5, 2006; published Mar. 6, 2008, U.S. Publication No. 2008-0055495-A1.

United States Patent And Trademark Office Non-Final Office Action mailed May 26, 2009 for U.S. Appl. No. 11/515,011, filed Sep. 5, 2006, published Mar. 6, 2008; U.S. Publication No. 2008-0055495-A1.

United States Patent And Trademark Office Non-Final Office Action mailed Jun. 23, 2009 for U.S. Appl. No. 11/528,404, filed Sep. 28, 2006; published Apr. 3, 2008; U.S. Publication No. 2008-0079687-A1.

United States Patent And Trademark Office Non-Final Office Action mailed May 24, 2010 for U.S. Appl. No. 11/514,912, filed Sep. 5, 2006, published Mar. 6, 2008; U.S. Publication No. 2008-0055261-A1.

Cernasov, Response to USPTO Non-Final Office Action mailed May 24, 2010 for U.S. Appl. No. 11/514,912.

* cited by examiner

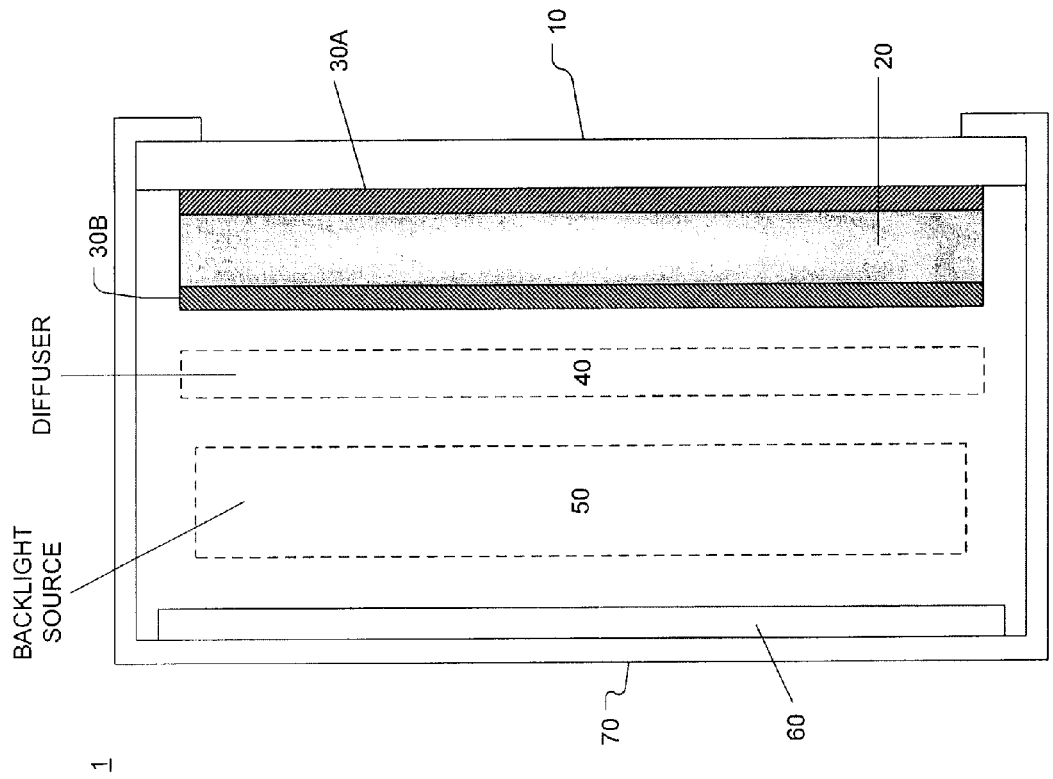

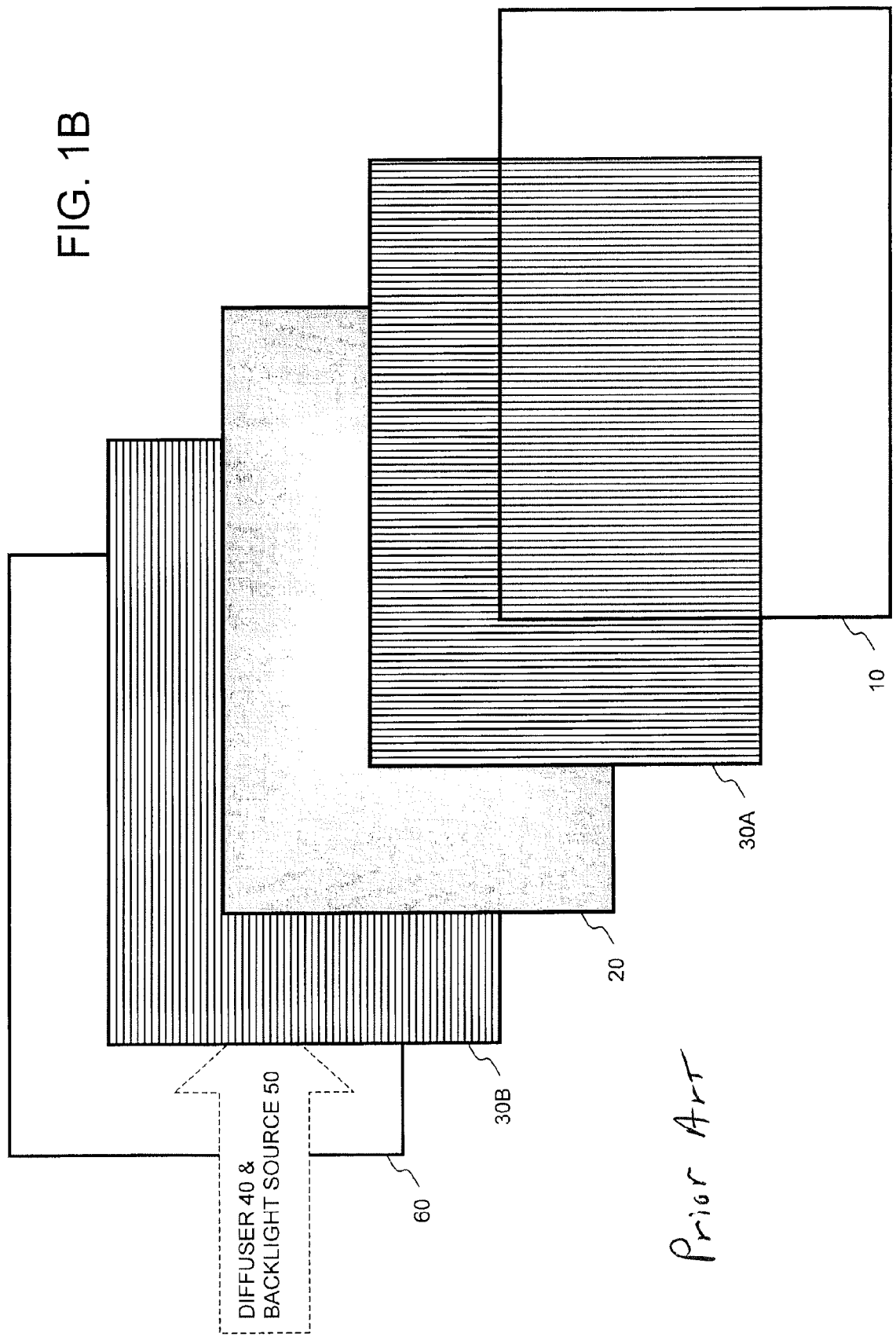

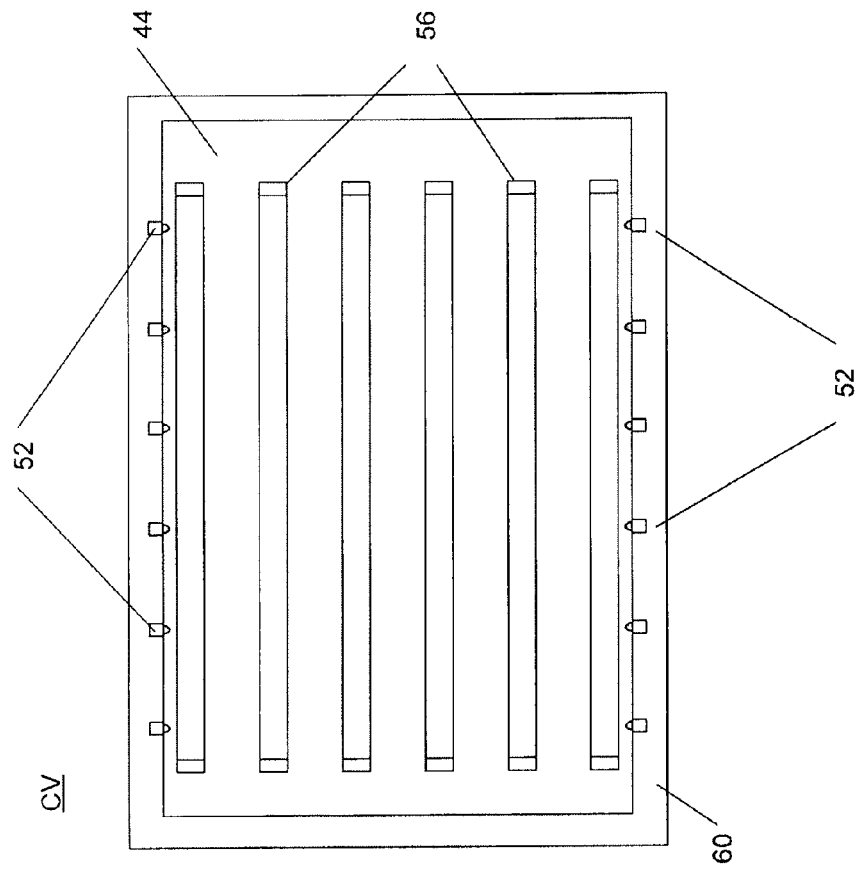
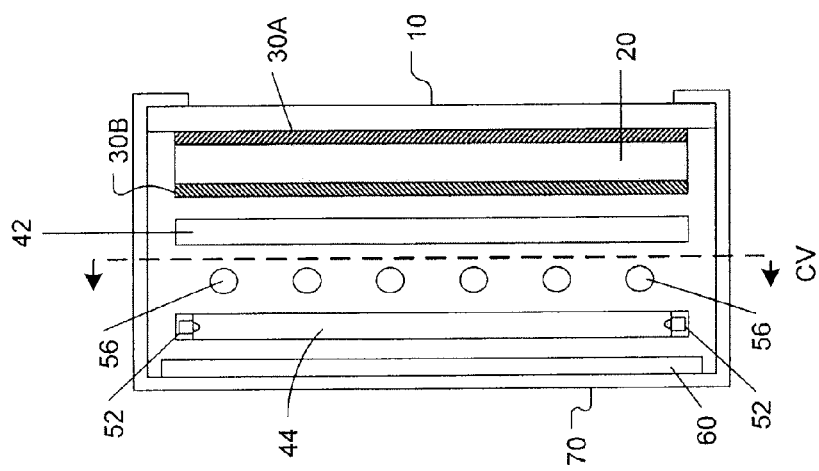
FIG. 2A
FIG. 2B
Prior Art

LCD TOUCHSCREEN PANEL WITH SCANNING BACKLIGHT

CROSS-REFERENCES TO RELATED APPLICATIONS

The present invention is related to co-pending U.S. patent application Ser. No. 11/514,912, entitled "LCD PANEL WITH INTEGRAL TOUCHSCREEN," which was filed on Sep. 5, 2006, and copending U.S. patent application Ser. No. 11/515,011, entitled "LCD PANEL WITH SYNCHRONIZED INTEGRAL TOUCHSCREEN," which was filed on Sep. 5, 2006. The entire contents of the above-identified related applications are hereby incorporated by reference in their entirety.

FIELD OF THE INVENTION

The present invention relates to a liquid crystal display (LCD) panel with an integrated touchscreen, and more particularly, to providing sensors within the LCD panel for detecting user contact with a particular touchscreen key.

BACKGROUND OF THE INVENTION

For many types of interactive applications, touchscreens are ideal interface devices. This is because they are intuitive, reprogrammable, and capable of being environmentally sealed. Also, touchscreens occupy a relatively small amount of space. Thus, it would be desirable to incorporate touchscreen functionality in applications utilizing liquid crystal display (LCD) panels.

The configuration of a typical LCD device is illustrated in FIGS. 1A and 1B. As shown in FIG. 1A, a typical LCD device 1 includes a liquid crystal (LC) layer 20 sandwiched between two polarizing filters 30A and 30B (hereafter "polarizers"). The LC layer is protected by a transparent front protective sheet 10, e.g., a glass plate. For a backlit LCD device 1, behind the LC and polarizing layers are a light diffusing film 40 (hereafter "diffuser"), a backlight source 50, and a reflective surface 60. However, in a reflective-type LCD device 1, the diffuser 40 and backlight source 50 would be omitted (thus, these layers are illustrated by dotted lines in FIG. 1A). A casing or enclosure 70 is provided to hold the aforementioned layers in place. FIG. 1B illustrates an exploded view of the stack of LCD layers described above. The specification may collectively refer to these layers as the "LCD stack" of a backlit LCD device (including diffuser 40 and backlight source 50) or a reflective-type LCD device (without diffuser 40 or backlight source 50).

In a typical backlit LCD device (also referred to as a "transmissive" LCD device), the backlight is emitted directly from source 50 and reflected from reflective surface 60 to the diffuser 40. The diffuser 40 diffuses this light to make the intensity or brightness more uniform across the LCD. Polarizers 30A and 30B are cross-polarized with respect to each other.

Thus, the backlight polarized by polarizer 30B must be rotated to some extent by LC layer 20 in order to pass through polarizer 30A. The degree to which the LC layer 20 rotates the light is dependent upon the amount of voltage applied across the various liquid crystal molecules in the LC layer 20. For instance, a pair of electrodes (not shown) may be positioned across each LC cell to apply an appropriate voltage to "twist" the corresponding LC molecules, thereby rotating the backlight to pass through. In backlit LCD devices, numbers and characters are displayed according to the LC cells that allow light to pass through polarizers 30A and 30B.

FIGS. 2A and 2B illustrate the different types of backlight sources 50 that can be implemented in a typical backlit LCD device 1. Specifically, FIG. 2A illustrates a side view of a backlit LCD device 1, while FIG. 2B shows a cross-sectional view at CV.

As illustrated in FIGS. 2A and 2B, the backlight source 50 may include a combination of "pinpoint" light sources 52 (e.g., LED lamps) and/or cold cathode fluorescent lamps (CCFLs) 56. Furthermore, different types of diffusers 40 may be used. For instance, these figures show an edge-lit light guide/diffuser 44 dedicated specifically to the pinpoint LED sources 52. Also, a light-diffusing sheet 42 may be implemented in front of the CCFL sources 56.

As shown in FIGS. 2A and 2B, the pinpoint light sources 52 are configured to emit light into the edge-lit light guide/diffuser 44, which is situated parallel to the LC layer 20. As such, the edge-lit light guide/diffuser 44 is intended to distribute the light from the pinpoint light sources 52 more uniformly. The combination of the edge-lit light guide/diffuser 44 and LED light sources 52 is generally referred to as an LED edge-lit light guide assembly.

However, as mentioned above, an alternative to backlit LCD devices are reflective-type LCDs. In a reflective-type LCD device, the LC layer 20 is illuminated by external light. Referring again to FIGS. 1A and 1B, after passing through the LC layer 20 and polarizers 30A and 30B, the external light is reflected (and optionally diffused) by the reflective surface 60 back to the viewer. In such devices, the cells in the LC layer 20 are configured, by default, to allow light to pass through. Thus, numbers and characters are displayed using LC cells, which are charged by electrodes (not shown) to block light from passing through polarizers 30A and 30B.

Generally, previous attempts to utilize a touchscreen in conjunction with an LCD panel (backlit or reflective-type) require additional panels or layers to be added to the front protective sheet of the LCD device. This is disadvantageous because it reduces the amount of output light from the LCD, increases the complexity of the resultant device, and reduces overall system reliability.

SUMMARY OF THE INVENTION

Exemplary embodiments of the present invention are directed to a liquid crystal display (LCD) device with an integrated touchscreen, in which at least one probe signal source and at least one probe signal sensing device are built within the LCD stack behind the liquid crystal (LC) layer. The probe signal source is configured to transmit the probe signal through the LC layer and the touchscreen surface. Thus, when the probe signal sensing device detects a reflection of the probe signal from the touchscreen surface, the LCD device determines that a user has made contact with the touchscreen surface.

In an exemplary embodiment, the touchscreen surface is partitioned according to a plurality of touchscreen keys from which the user may choose. When user contact is detected, the LCD device further determines which of the touchscreen keys has been touched; Accordingly, the LCD device may include an array of probe light sources and sensors such that, in a given application, each touchscreen key may be assigned a dedicated probe light source and sensor. Thus, the LCD device can distinguish between user contact with different keys as a function of which probe light sensor detected contact.

According to a further exemplary embodiment, the LCD device is configured to operate according to two interleaved modes: normal display mode and touchscreen mode. In normal display mode, the LCD device operates to display the touchscreen contents (keys, etc.) to the user. In touchscreen mode, the LCD device operates to detect contact with a particular key.

Specifically, during touchscreen mode, each key is made "active" (along with the corresponding probe lights source and sensor) for a given interval, during which the surrounding touchscreen keys are inactive. A scanning or timesharing scheme may be implemented, according to which the touchscreen keys are made active. Since each probe light source is turned on only when its corresponding key is active, the LCD device in essence employs an active probe signal that "scans through" a set of keys, thereby enhancing discrimination among the keys.

According to another exemplary embodiment, the LC layer may similarly be partitioned according to the touchscreen keys. During touchscreen mode, the LC layer is configured to provide a transparent "opening" for each touchscreen key as it becomes active. Specifically, this opening allows the probe light source of the active key to transmit through the LC layer toward the touchscreen surface. While this probe light opening is provided for the active key, the LC layer partitions of neighboring keys are made opaque. As such, the probe light opening helps ensure that the probe light sensor of the active key does not detect a "false hit," i.e., a reflection of probe light resulting from contact with a neighboring key.

Therefore, the LC layer provides the probe light opening in a manner that is synchronized with the scanning or timesharing process by which touchscreen keys are made active.

As an alternative exemplary embodiment, it may not be necessary for the LCD device to include the probe light sources. Instead, the probe light sensors may be configured to detect user contact with a particular key by sensing whether or not external light is transmitting through an active key. For instance, when ambient light in the environment is being blocked by the user's touch, a determination that the active key is being touched may be made by the corresponding probe light sensor.

Further aspects in the scope of applicability of the present invention will become apparent from the detailed description provided below. However, it should be understood that the detailed description and the specific embodiments therein, while disclosing exemplary embodiments of the invention, as provided for purposes of illustration only.

BRIEF DESCRIPTION OF THE DRAWINGS

A more complete understanding of the present invention will become apparent from the following description taken in conjunction with the accompanying drawings, which are given by way of illustration only and, thus, are not limitative of the present invention. In these drawings, similar elements are referred to using similar reference numbers, wherein:

FIGS. 1A and 1B illustrate the configuration of a typical liquid crystal display (LCD) device;

FIGS. 2A and 2B illustrate different types of backlight sources within typical backlit LCD devices;

FIG. 3A illustrates an exemplary set of touchscreen keys for a particular application, while

DETAILED DESCRIPTION OF EXEMPLARY EMBODIMENTS

In order to integrate a touchscreen interface with a liquid crystal display (LCD) device, the present invention utilizes probe signals transmitted from within the stack of LCD layers to detect user contact with the touchscreen surface. Specifically, a corresponding probe signal source and sensor are disposed within the LCD stack for each touchscreen key. By sensing a reflection of the probe signal from the touchscreen surface, each probe signal sensor is capable of detecting user contact with the corresponding touchscreen key. Accordingly, the front protective sheet of the LCD device may be used as the touchscreen surface without requiring additional layers.

According to an exemplary embodiment, the source of the probe signals may comprise a plurality of probe light sources implemented behind the liquid crystal (LC) layer within the LCD casing or enclosure. Each probe light source may be paired with a probe light sensor, which is similarly implemented behind the LC layer to sense the reflection of probe light. For a given touchscreen application, each set of probe light source and sensor may be assigned to a corresponding touchscreen key.

Figure 3A:
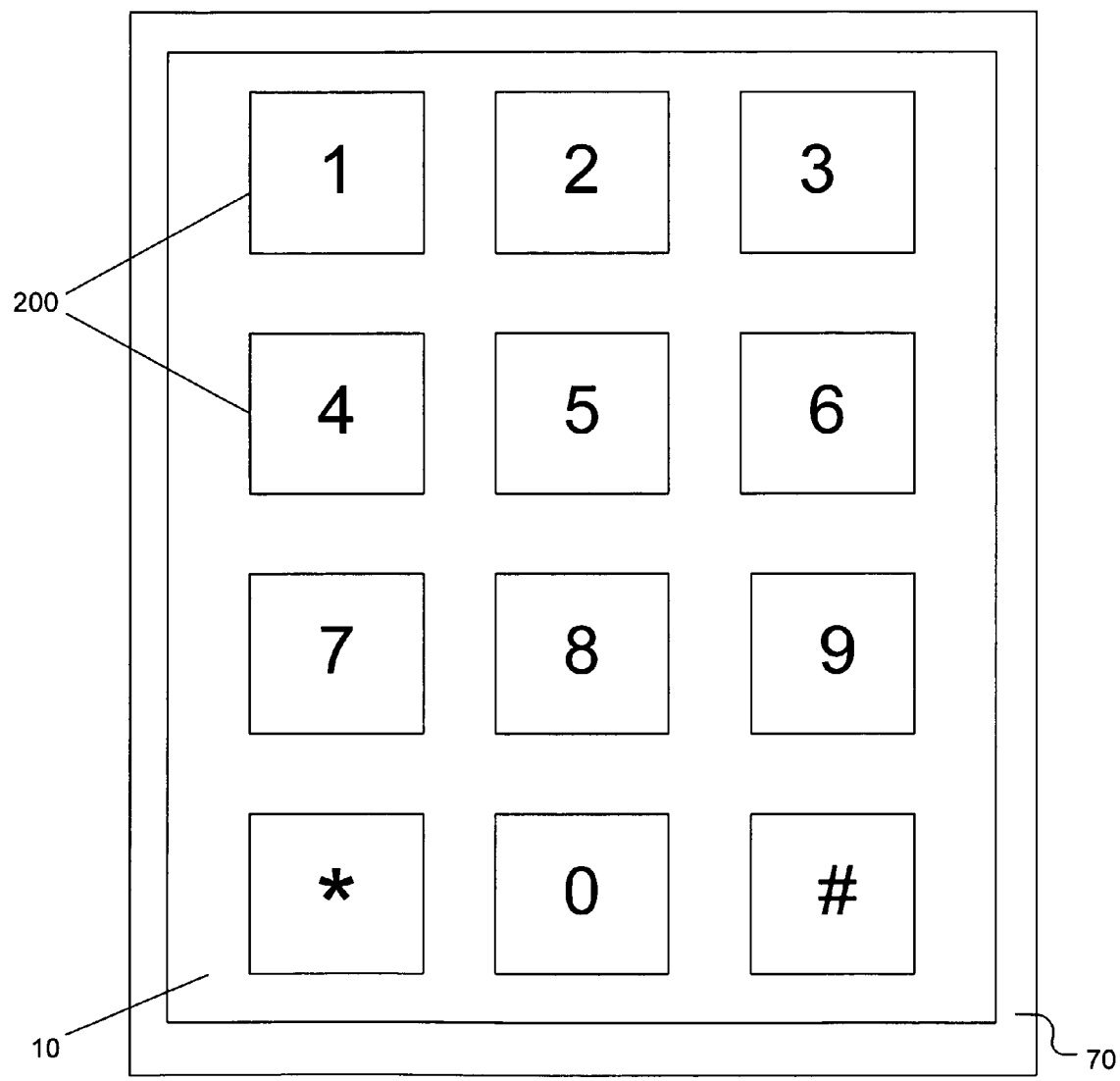
Figure 3B:
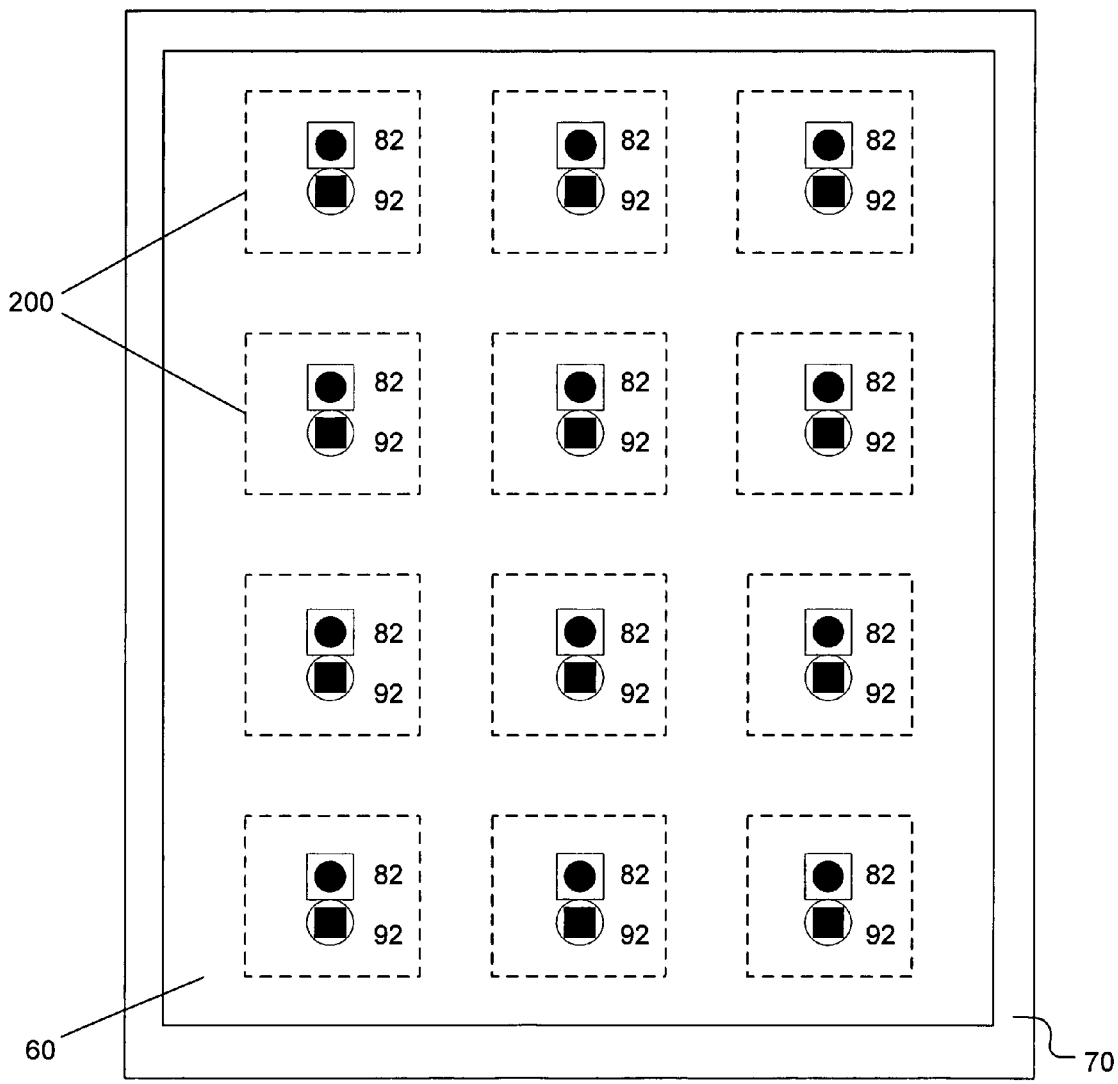
FIG. 3B illustrates an assignment of probe light sources and sensors to the corresponding touchscreen keys, according to an exemplary embodiment of the present invention.
Figure 3C:
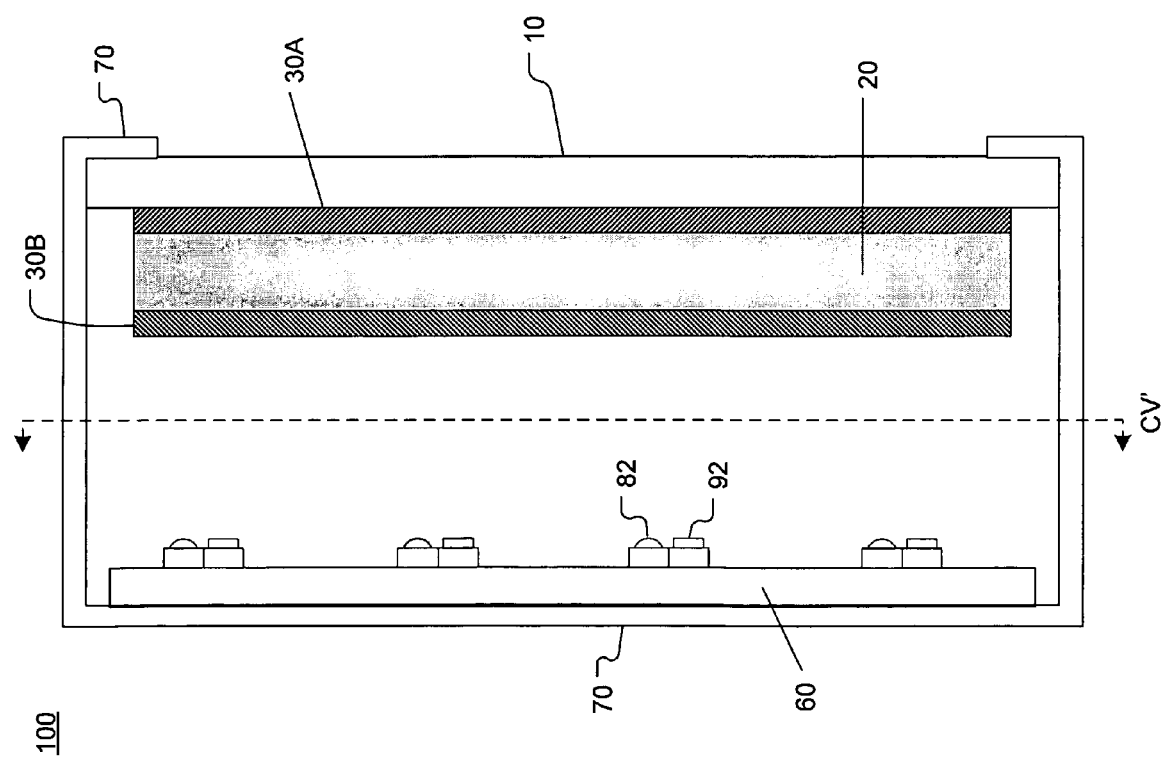
FIG. 3C illustrates the implementation of probe light sources and sensors, as assigned in FIGS. 3A and 3B, in an LCD stack according to an exemplary embodiment of the present invention.

FIGS. 3A-3C illustrate a set of probe light sources 82 and sensors 92, which are assigned to a set of touchscreen keys 200 for a particular touchscreen application of LCD device 100. For instance, FIG. 3A shows a set of touchscreen keys 200 corresponding to numerical keys of a traditional push-button telephone. Of course, this is provided merely for the purpose of illustration, and the types of touchscreen keys are purely a matter of design choice depending on the given application.

FIG. 3B more particularly illustrates the assignment of each set of probe light source 82 and sensor 92 to a corresponding touchscreen key 200. Specifically, FIG. 3B illustrates a planar view at cross-section CV' of the LCD device 100 illustrated in FIG. 3C. Although FIG. 3B illustrates a "one-to-one" correspondence between the touchscreen keys 200 and the sets of probe light source 82 and sensor 92, this need not be the case. For example, in another embodiment of the present invention, the number of probe light sources 82 and sensors 92 may exceed the number of touchscreen keys 200 of a particular application. This allows the LCD device 100 to be compatible with a number of touchscreen interface applications that utilize a different number of keys 200. For each application, however, each touchscreen key 200 is assigned a particular probe light source 82 and sensor 92, which are disposed at the corresponding position with respect to the touchscreen surface, i.e., behind the corresponding partition of the LC layer 20.

As such, when user contact is made with the touchscreen surface, the particular key 200 being touched can be determined based on the relative position of the probe light sensor 92 that detects the user contact.

Figure 7:
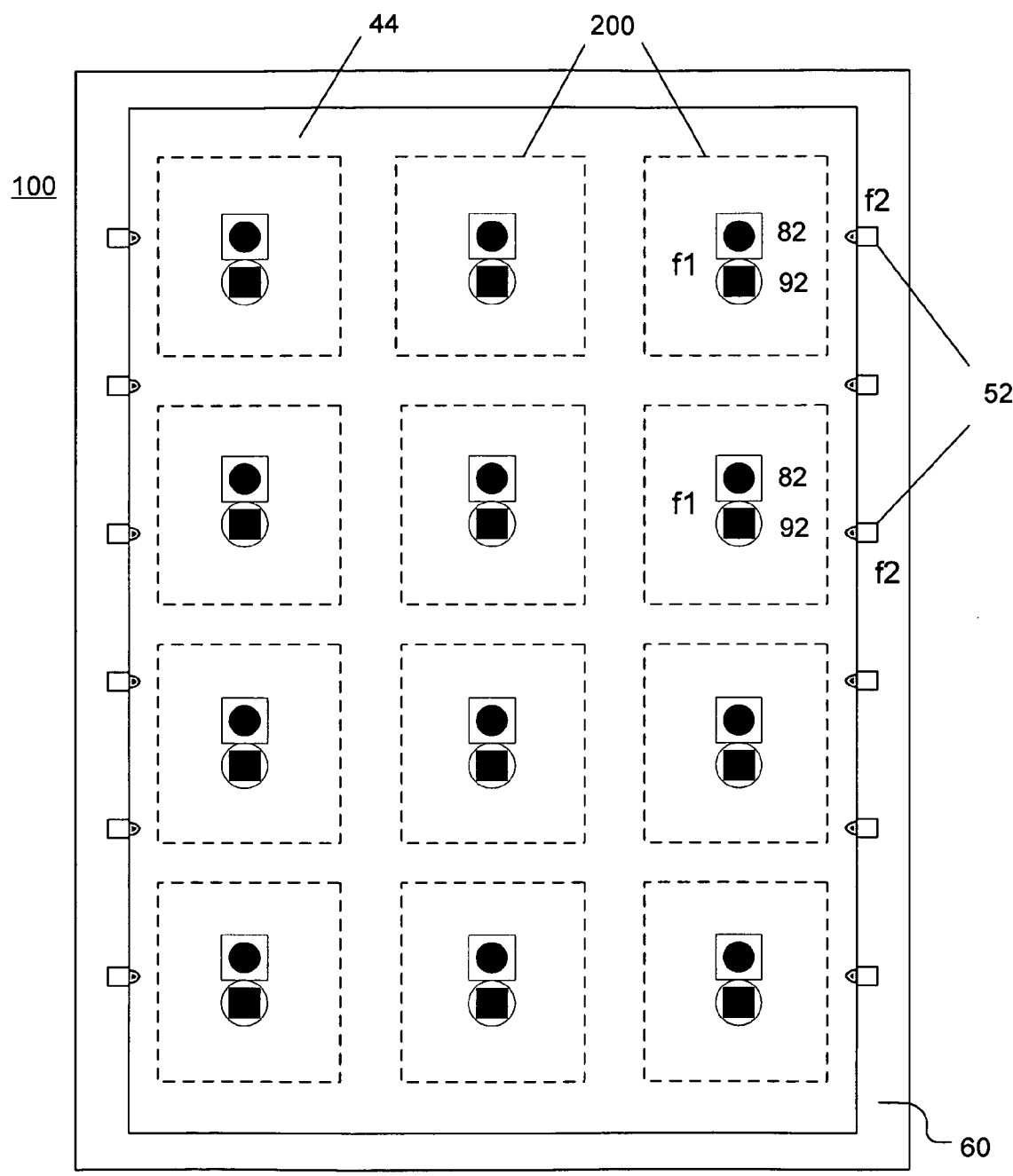
FIG. 7 illustrates the implementation of probe light sources and sensors within an LCD device utilizing a backlight source, according to an exemplary embodiment of the present invention.

It should be noted that principles of the present invention may be implemented in an LCD device 100 utilizing a backlight source. For instance, FIG. 7 illustrates a planar view of a cross-section of an LCD device 100 utilizing an LED edge-lit light guide apparatus. As shown in FIG. 7, the probe light sources 82 and sensors 92 may be installed behind the light guide 44 of the LCD stack (see FIG. 2A). In order to discriminate the probe light from the backlight, the probe light sources 82 may be modulated at a different frequency f1, than the frequency f2 of the LEDs 52.

For example, the frequency f1 of the probe light sources 82 may be operated at a frequency of 100 kHz and the backlights may be DC sources or operated at 60 Hz. Another example is that the probe light sources 82 may be chosen as infrared, while the backlights are visible light sources.

However, other embodiments are contemplated where it is not necessary to modulate the probe light sources 82 at a different frequency than other backlight sources. According to an exemplary embodiment, during operation, the LCD device 100 may alternate between a normal backlight display mode and touchscreen mode in an interleaved manner. In normal display mode, the LCD device 100 may use the backlight source(s) to display the contents of the touchscreen interface (touchscreen keys, etc.) to the user. Thus, during normal display mode, the LEDs 52 are operative and the probe light sources 82 are turned off, as shown in FIG. 7.

During touchscreen mode, however, the LEDs 52 may be turned off, while the probe light sources 82 are turned on (e.g., according to a scanning or timesharing scheme by which the corresponding keys 200 are made active). Also, the probe light sources 82 may have dual functionality, operating as backlight sources when the LCD device 100 is operating according to the normal display mode.

It should be noted that reflective-type LCD devices 100 may also be configured to operate according to normal display and touchscreen modes, in an interleaved manner. For instance, when switching from normal display mode to touchscreen mode, the polarizers 30A and 30B and LC layer 20 may be switched to a configuration that accommodates the use of probe light sources 82 and sensors 92.

Furthermore, another exemplary embodiment allows the LCD device 100 utilizes external light present in the environment, rather than an internal probe light. For example, each probe light sensors 92 may be configured to detect user contact with a particular touchscreen key 200 by sensing whether or not the external light is transmitting through the key 200. When such light is being blocked by the user's touch, the corresponding probe light sensor 92 may sense the lack of external light, and thereby detect the touch.

However, unless otherwise specified, the following description will assume the use of probe light sources 82, unless otherwise noted. It will be readily apparent, however, that many of the principles to be described are also applicable to embodiments where the probe light sensors 92 are configured to detect external light, rather than an internal probe light.

As described above, in order to help further discriminate between touches with different touchscreen keys 200, each key 200 may be made active during touchscreen mode according to a scanning or timesharing scheme. In such a scheme, when one touchscreen key 200 is active, the neighboring keys 200 are inactive. As such, the probe light source 82 corresponding to each key 200 is turned on only when that key 200 is made active. Furthermore, the LC layer 20 may be configured to provide a probe light opening only for the active touchscreen key 200.

Specifically, the LC layer 20 may be partitioned in accordance with the touchscreen keys 200, similar to the touchscreen surface (i.e., front surface 10). During touchscreen mode, each partitioned area of the LC layer 20 may be, by default, opaque so that it does not transmit or reflect light. However, as each key 200 is made active, the corresponding partition of the LC layer 20 is switched from being opaque to transparent, thereby allowing the corresponding probe light source 82 to transmit through. Thus, as each partition of the LC layer 20 becomes transparent, it creates a probe light opening for the corresponding touchscreen key 200. This probe light opening may scan through the LC layer partitions according to the same scanning or timesharing process by which the touchscreen keys 200 are made active.

Figure 4A:
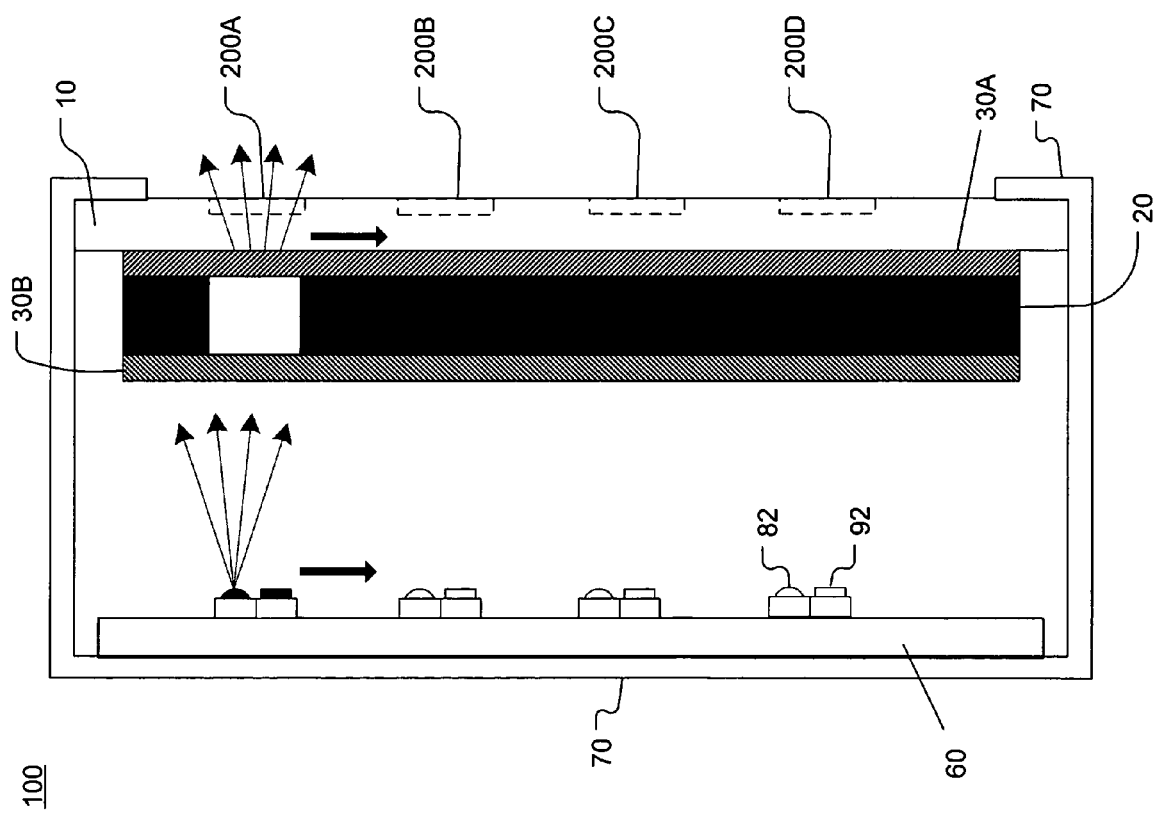
FIGS. 4A and 4B provide views of the LCD stack to illustrate the scanning process whereby touchscreen keys are made active, according to an exemplary embodiment of the present invention.
Figure 4B:
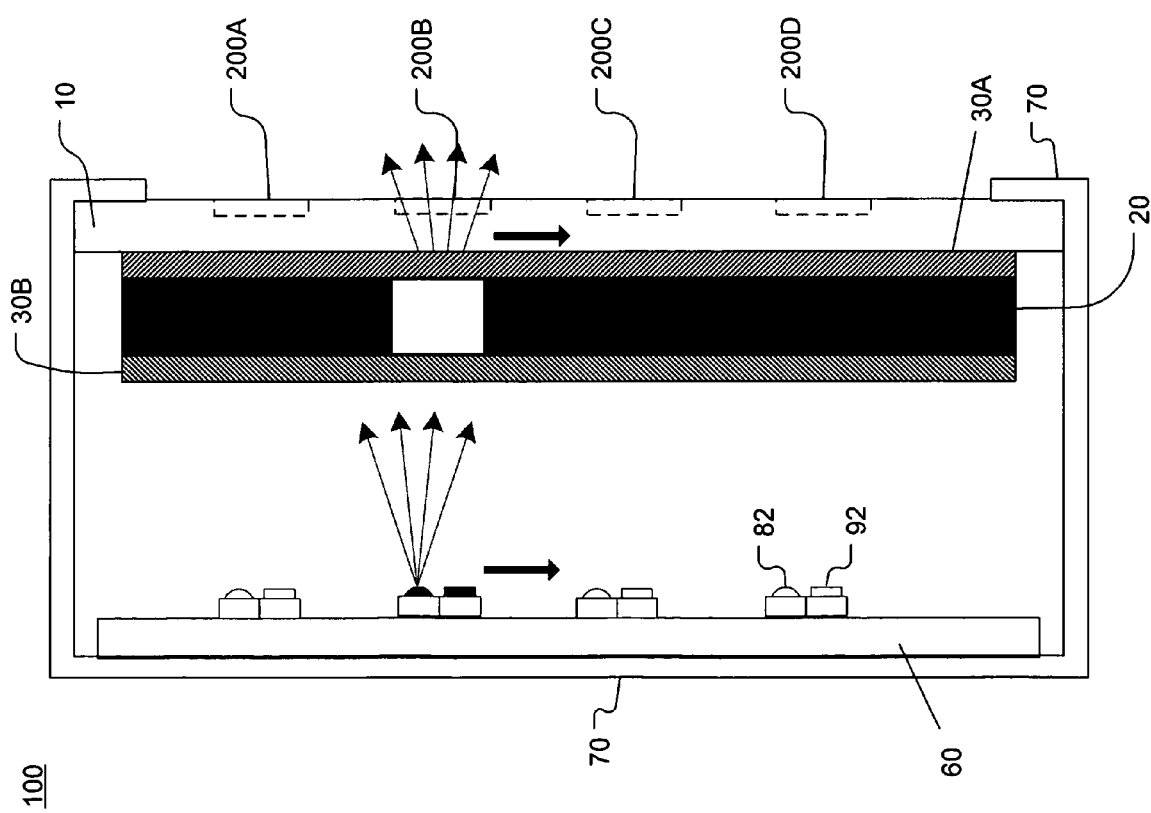

FIGS. 4A and 4B illustrate the scanning process for making the touchscreen keys 200 active and providing the probe light opening. For purposes of example, FIGS. 4A and 4B illustrate a situation where each of touchscreen keys 200A-200D is sequentially made active, while the remaining keys are inactive. For instance, in FIG. 4A, touchscreen key 200A is made active, and the corresponding probe light source 82 and sensor 92 are in operation. FIG. 4A also shows the LC layer 20 providing a probe light opening for the active touchscreen key 200A. However, FIG. 4B shows the next scanning interval, during which touchscreen key 200B is made active. As shown in FIG. 4B, the probe light source 82 and sensor 92 corresponding to key 200B are in operation, and the probe light opening has shifted to the corresponding partition of the LC layer 20.

Figure 8:
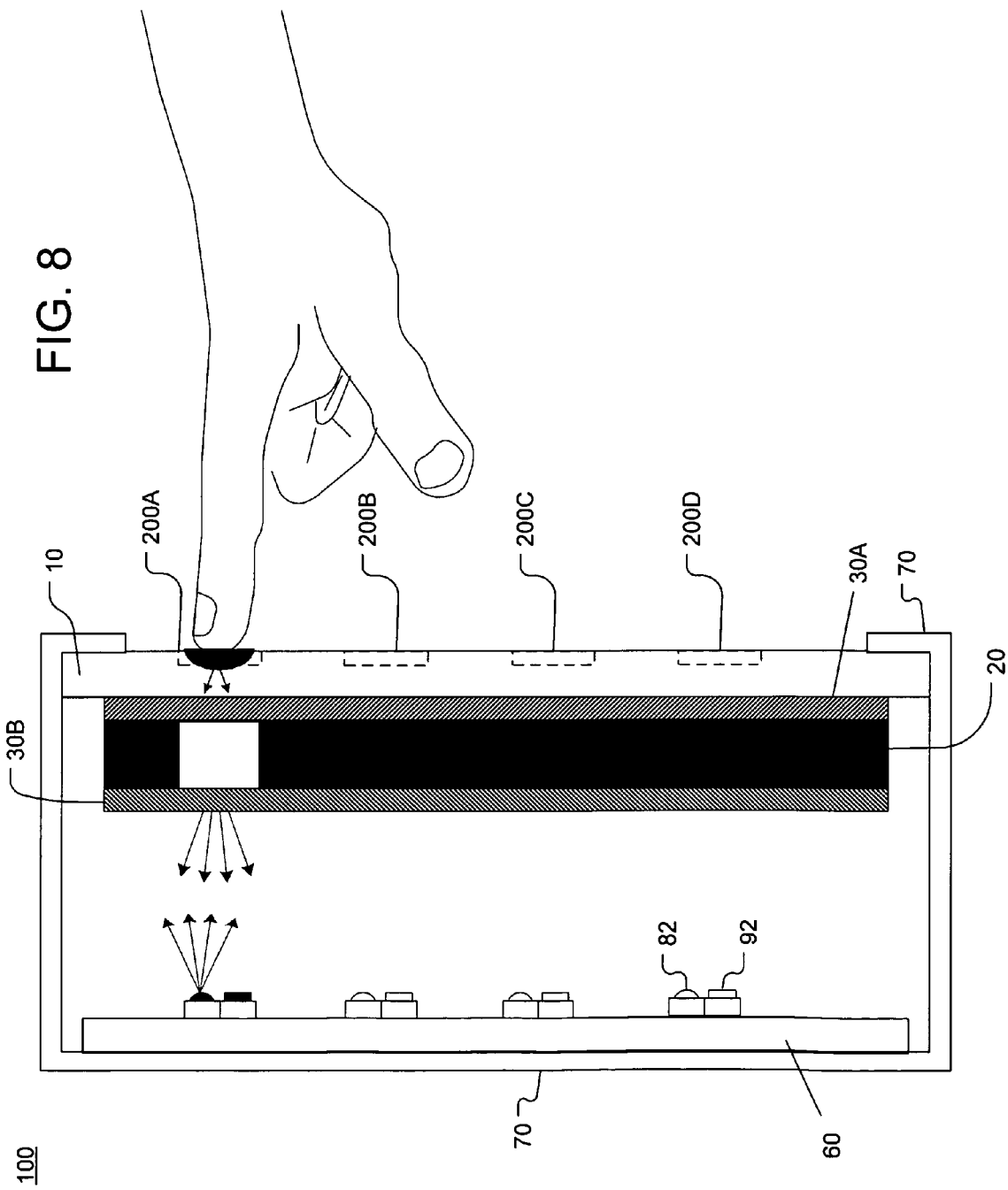
FIG. 8 illustrates the reflection of probe light to the probe light sensor as the corresponding touchscreen key is being touched by a user, according to an exemplary embodiment of the present invention.

As shown in FIGS. 4A and 4B, when there is no user contact, the probe light source 82 of the active key 200 will transmit through the LC layer 20 and touchscreen surface generally without impediment. Thus, the corresponding probe light sensor 92, will detect a relatively low intensity of probe light. FIG. 8, on the other hand, illustrates the situation where a user makes contact with a touchscreen key 200 (particularly, touchscreen key 200A). As shown in FIG. 8, when touchscreen key 200A is made active during touchscreen mode, the probe light from the corresponding source 82 is reflected at the point of contact on the touchscreen surface back through the probe light opening and the LC layer 20. Thus, the probe light sensor 92 corresponding to touchscreen key 200A will detect an increased intensity of the probe light, thereby indicating that the corresponding key 200A has been touched. According to an exemplary embodiment, an intensity threshold may be set for each probe light sensor 92. Thus, when the intensity measurement of the probe light sensor 92 corresponding to active key 200A exceeds the threshold, the LCD device 100 can determine that the corresponding touchscreen key 200 is being touched. As will be described in more detail below in connection with FIG. 9, a reference key may be further provided to help set the thresholds for the probe light sensors 92 in order to improve performance of the LCD device 100.

The scanning of a probe light opening, as described above, may also be implemented in embodiments of the LCD device 100 that require the probe light sensors 92 to detect the user touch based on external light, rather than internal probe light sources 82. For instance, as each touchscreen key 200 is made active based on the probe light opening, the corresponding probe light sensor 92 is put in operation to sense the level external light passing through the opening. For instance, when the level of external light sensed by the corresponding probe light sensor 92 is below a threshold, this indicates that the user's touch is blocking the external light from passing through the active key 200.

Figure 5B:
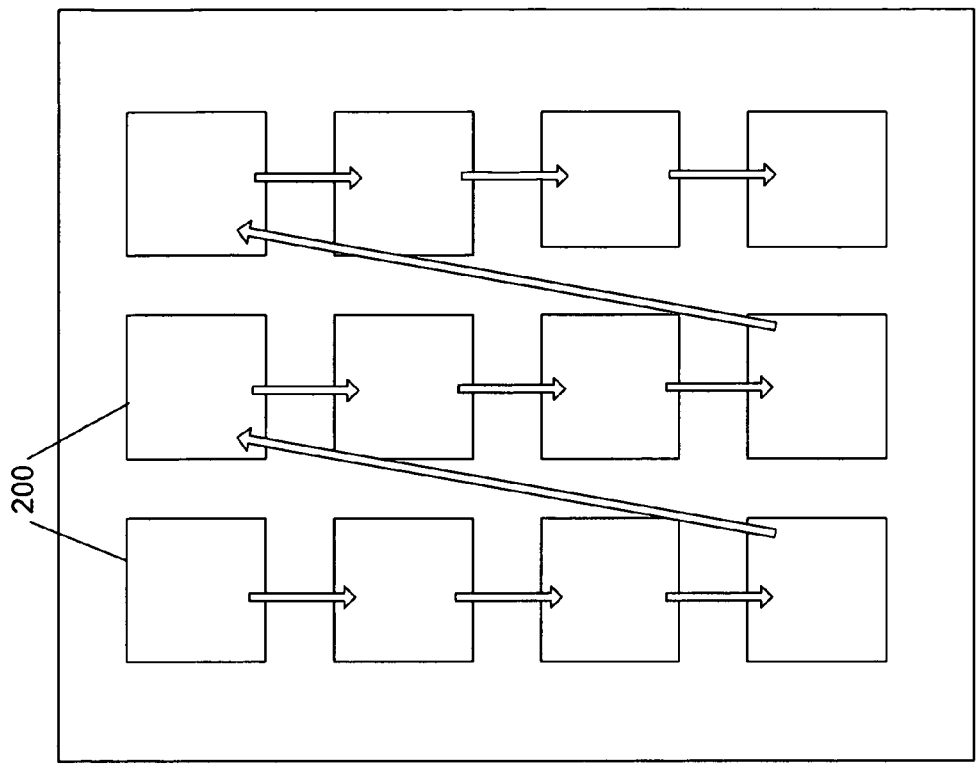
FIGS. 5A and 5B illustrate alternative scanning patterns whereby the touchscreen keys are made active, according to alternative exemplary embodiments of the present invention.
Figure 5A:
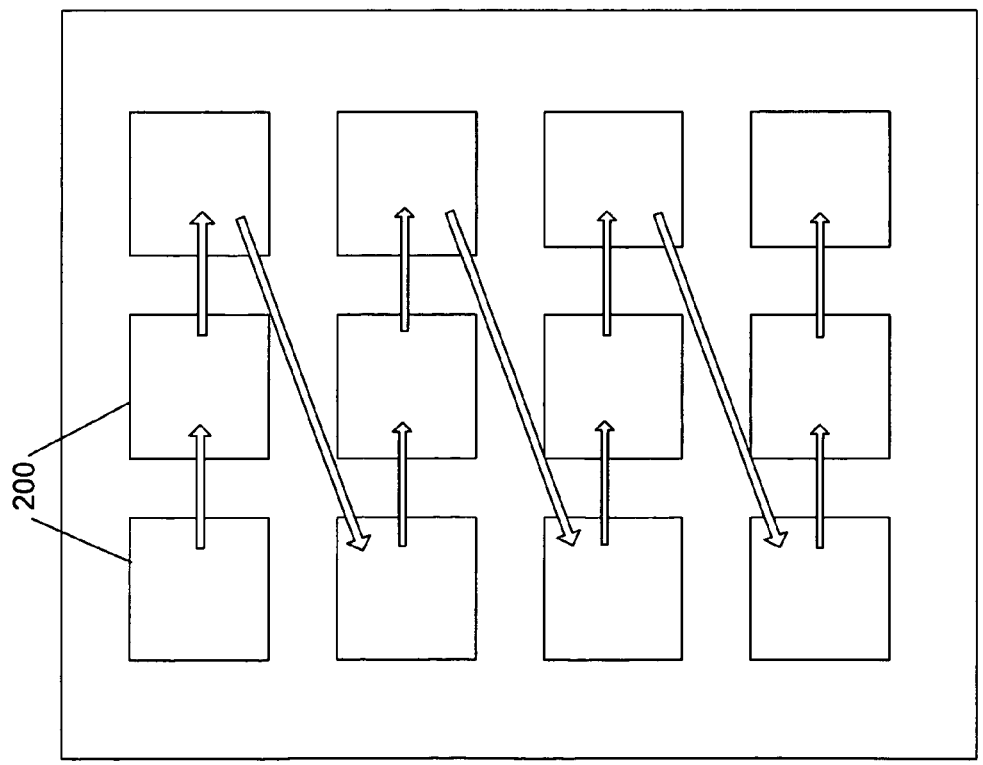

In the embodiments described above, when a particular touchscreen key 200 is made active, the neighboring keys 200 should be made inactive to facilitate discrimination between the keys 200. According to an exemplary embodiment, during touchscreen mode, the active probe signal scans through the touchscreen keys 200 in such a manner that only one key 200 on the touchscreen surface is active during a given interval. For example, in the interface application illustrated in FIGS. 3A-3C, the keys 200 may be made active according to the sequence illustrated in FIG. 5A or FIG. 5B. In other words, FIGS. 5A and 5B illustrate alternative patterns whereby an active probe signal scans through the keys 200. Of course, FIGS. 5A and 5B are provided for illustration only, and other scanning patterns may be implemented. Furthermore, it is not necessary for all the keys 200 to be scanned through during one cycle of the touchscreen mode. Since the interleaving rate between normal display mode and touchscreen mode is assumed to be relatively high, it is possible to allow the probe signal to scan through all of the touchscreen keys 200 over a plurality of touchscreen mode cycles. For example, it is contemplated that an interleaving rate of 60, 90, or 120 Hz could be used.

However, for touchscreen applications that provide a higher number of keys 200, it may be advantageous to allow multiple active probe signals to simultaneously scan through the keys 200. To do this, the touchscreen keys 200 may be divided into separate groups or "blocks." During touchscreen mode, one touchscreen key 200 in each of these blocks may be concurrently made active. Accordingly, the LC layer 20 concurrently provides a probe light opening for each of these blocks.

Figure 6B:
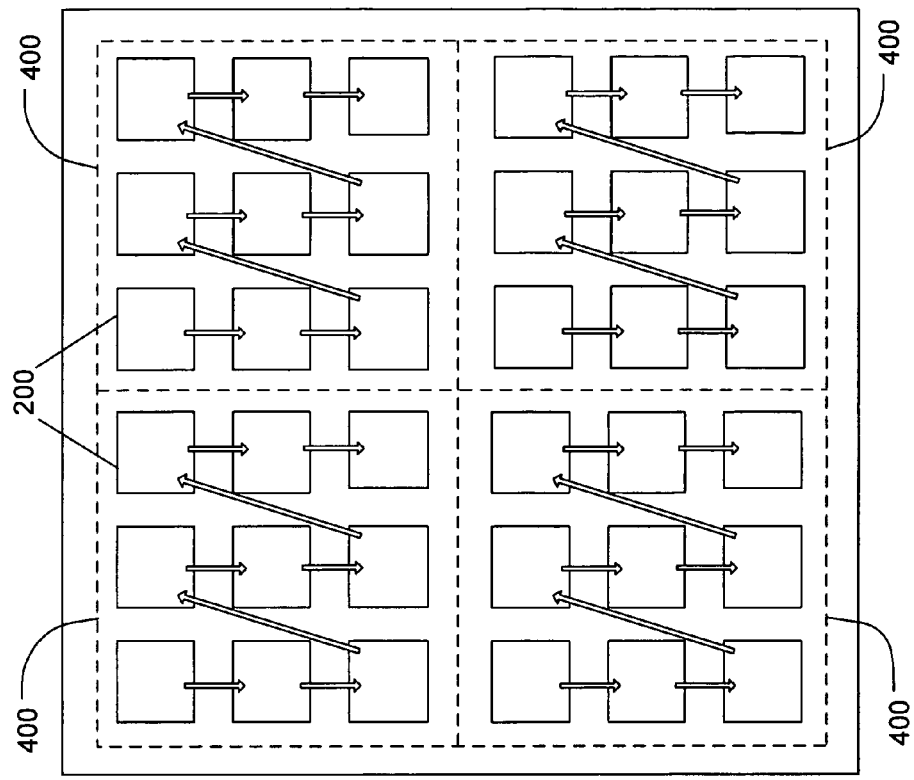
FIGS. 6A and 6B illustrate alternative scanning patterns when the touchscreen keys are grouped into blocks, which are concurrently provided probe light openings, according to alternative exemplary embodiments of the present invention.
Figure 6A:
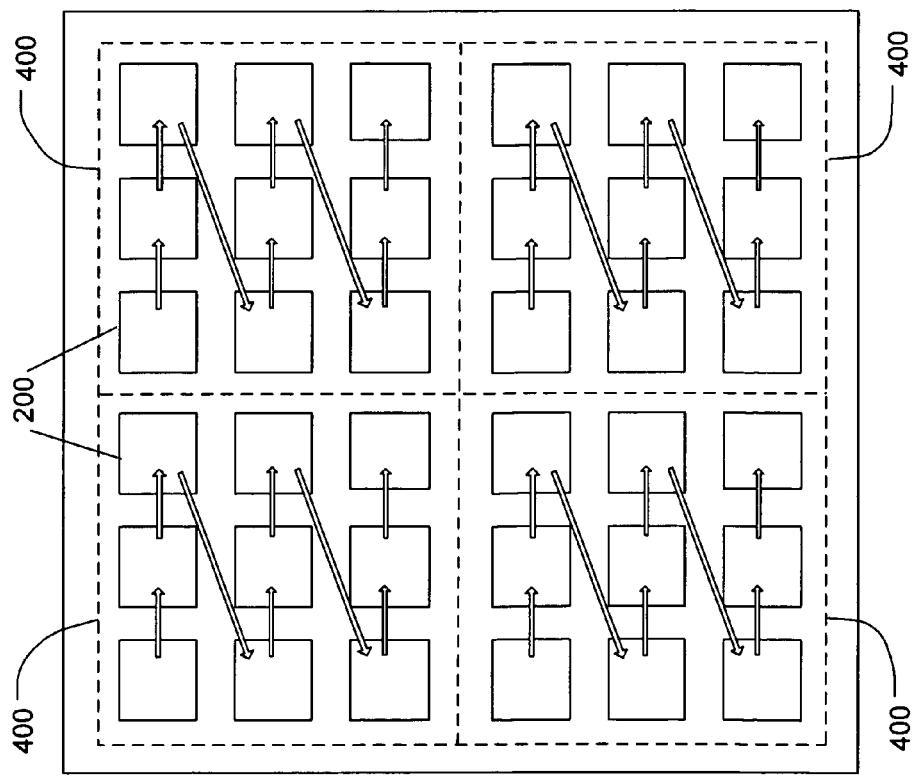

FIGS. 6A and 6B illustrate an exemplary embodiment where the touchscreen keys 200 are grouped together into blocks 400. These figures show alternative scanning patterns that may be concurrently implemented for the probe signal in each block 400. Of course, FIGS. 6A and 6B are provided for purposes of illustration only. For instance, the probe signal in each block 400 may scan through the keys 200 according to other patterns. Furthermore, it is not necessary to implement the same scanning pattern for each block 400.

As discussed above, user contact with a particular touchscreen key 200 may be detected when the corresponding probe light sensor 92 measures an intensity level of the probe light (reflected from the touchscreen surface) that exceeds a certain threshold. Alternatively, if the user touch is detected based on external light, rather than the probe light, the touch may be detected when the measure intensity level of the active probe light sensor 92 is below the relevant threshold.

Figure 9:
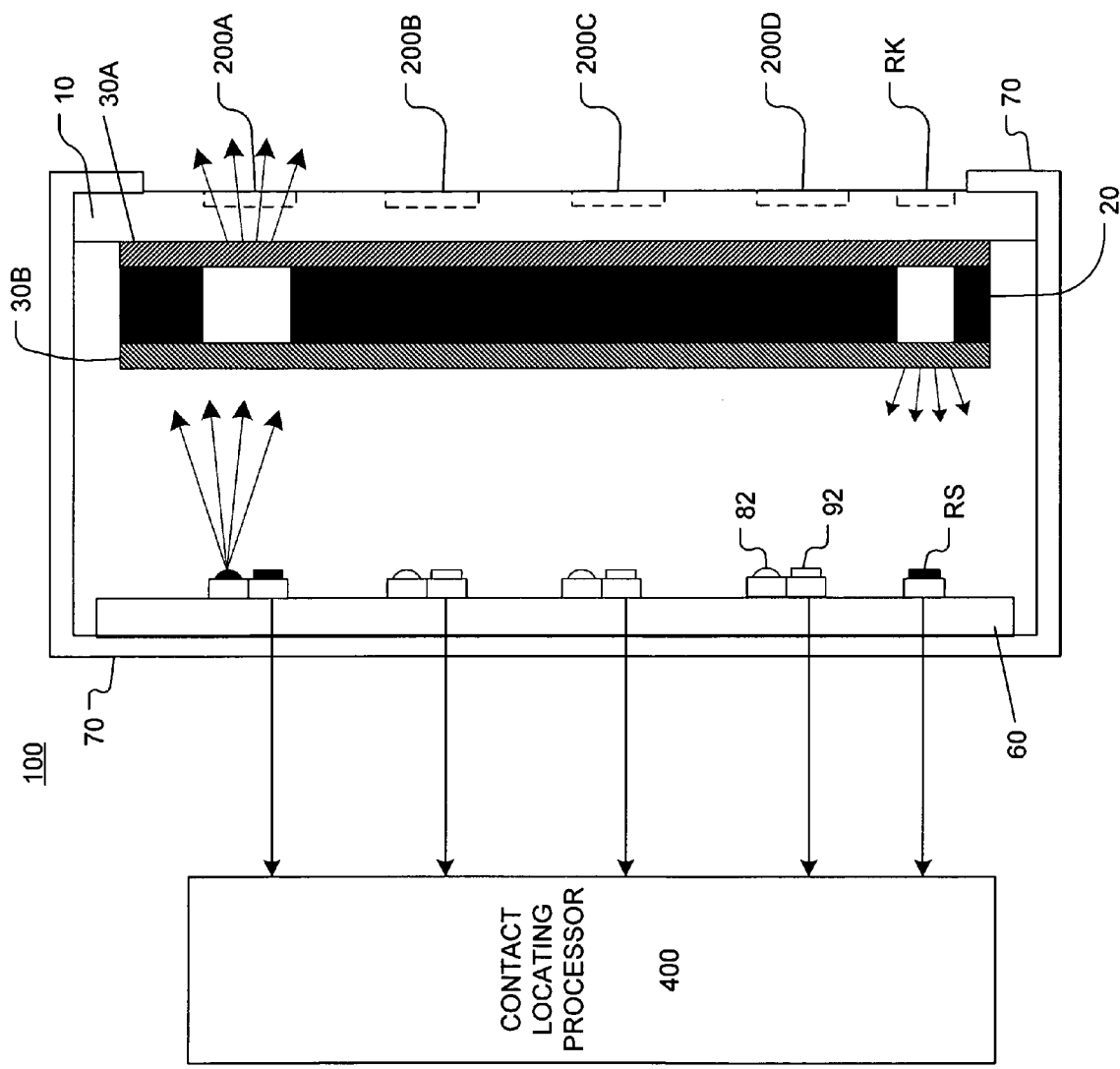
FIG. 9 illustrates additional elements in the LCD device for processing measurements from the probe light sensors and compensating for the effects of ambient light, according to an exemplary embodiment of the present invention.

As illustrated in FIG. 9, the LCD device 100 may include a contact locating processor 400 designed to receive intensity measurements from the probe light sensors 92 and compare them to the appropriate threshold(s). For each series of measurements received during a touchscreen mode cycle, the contact locating processor 400 may detect which, if any, of the measurements exceeds the threshold and correlate that measurement to the appropriate touchscreen key 200. If multiple measurements exceed the threshold, the contact locating processor may further be configured to execute one or more algorithms for determining which touchscreen key 200 has been touched. Such algorithms may involve, e.g., a comparison of intensity measurements.

The performance of the contact locating processor 400 may be improved through the use of "reference key." An example of a reference key RK is illustrated in FIG. 9. A light sensor RS may be included in the LCD stack to measure ambient light passing through the reference key RK. As such, the LC layer 20 provides a transparent opening corresponding to the location of the reference key RK. Based on measurements from the sensor RS, the contact locating processor 400 may adjust the threshold(s) corresponding to the probe light sensors 92, e.g., to compensate for the movement of the bias point of the probe light sensors 92. However, as an alternative to adjusting the threshold, the contact locating processor 400 may be designed to differentially process the intensity measurements to make the necessary compensation. According to the exemplary embodiment, the size and shape of the transparent opening in the LC layer for reference key RK should be of a similar size and shape as the probe light opening for the active touchscreen key 200.

Exemplary embodiments having been described above, it should be noted that such descriptions are provided for illustration only and, thus, are not meant to limit the present invention as defined by the claims below. Any variations or modifications of these embodiments, which do not depart from the spirit and scope of the present invention, are intended to be included within the scope of the claimed invention.

What is claimed is:

1. A liquid crystal display (LCD) device configured to operate under at least a normal display mode and a touchscreen mode comprising:
   a casing;
   a transparent touchscreen surface held into place by the casing;
   a liquid crystal (LC) layer disposed within the casing behind the touchscreen surface, at least part of the LC layer being partitioned according to a plurality of touchscreen keys;
   at least one probe light sensor disposed within the casing behind the LC layer and configured to detect user contact with at least one of the plurality of touchscreen keys using a light sensing operation while the device is in the touchscreen mode and not detect user contact while the device is in a display mode; and
   one or more probe light emitters disposed within the casing behind the LC layer, each probe light emitter configured to emit consubstantial light that impinges upon the at least one of the plurality of touchscreen keys to be detected by the light sensing operation.

2. The LCD device of claim 1, wherein the LCD device includes a backlight source configured to transmit backlight through the touchscreen surface to convey information to a user.

3. The LCD device of claim 2, wherein the backlight source comprises a plurality of light-emitting diodes (LEDs) emitting light consubstantial to the probe light source.

4. The LCD device of claim 1, further comprising:
at least one probe light source disposed within the casing behind the LC layer, the probe light source being configured to transmit a probe light through the touchscreen surface,
wherein the at least one probe light sensor is configured to detect the user contact with a corresponding touchscreen key of the plurality by sensing a reflection of the probe light from the touchscreen surface.

5. The LCD device of claim 1, wherein at least part of the touchscreen surface is partitioned according to the plurality of touchscreen keys,
the device further comprises a plurality of probe light sources and probe light sensors, and
each touchscreen key of the plurality is matched up with a corresponding probe light source and probe light sensor.

6. The LCD device of claim 5, wherein each probe light source is a light-emitting diode (LED).

7. The LCD device of claim 5, wherein each probe light source modulates the probe light at a frequency above 50 Hz.

8. The LCD device of claim 5, wherein the each probe light source emits the probe light as an infrared signal.

9. The LCD device of claim 5, wherein each corresponding set of probe light source and probe light sensor is disposed within the casing behind the corresponding touchscreen key.

10. The LCD device of claim 9, wherein the LC layer partitions are configured to provide the probe light opening to the touchscreen keys according to a timesharing scheme during touchscreen mode.

11. The LCD device of claim 10, wherein the touchscreen keys are grouped into blocks, and the LC layer partitions are configured to concurrently provide probe light openings for each block of touchscreen keys, each probe light opening being provided according to a timesharing scheme.

12. The LCD device of claim 9, wherein, during touchscreen mode, each probe signal source is selectively turned on when the corresponding touchscreen key is active and turned off when the corresponding touchscreen key is inactive.

13. The LCD device of claim 12, wherein user contact with a particular touchscreen key is detected when a measured intensity at the corresponding probe light sensor exceeds a predetermined threshold while the touchscreen key is active.

14. The LCD device of claim 13, further comprising:
reference light sensor; and
a reference partition in the LC layer corresponding to the reference light source and reference light detector,
wherein the reference partition is configured to provide a reference light opening during normal mode, through which the reference light sensor measures a reference light intensity, and the threshold is calibrated according to the measured reference light intensity.

15. The LCD device of claim 1, further comprising a plurality of probe light sensors, each probe light sensor configured to detect the user contact with a corresponding touchscreen key by sensing a lack of external light transmitting through the touchscreen surface.

16. The LCD device of claim 1, wherein each of the probe light sensors disposed within the casing each emit a unique light frequency.

17. A liquid crystal display (LCD) device, configured to operate under a plurality of interleaved modes, comprising:
a casing;
a transparent touchscreen surface held into place by the casing, at least part of the touchscreen surface being partitioned into a plurality of LC partitions according to a plurality of touchscreen keys,
a liquid crystal (LC) layer disposed within the casing behind the touchscreen surface, at least part of the LC layer being partitioned according to the plurality of touchscreen keys, wherein each LC layer partition is configured to be selectively transparent and opaque during touchscreen mode, such that:
the LC layer partition is transparent while the corresponding touchscreen key is active, thereby providing a probe light opening for the corresponding touchscreen key, and
the LC partition is opaque while the corresponding touchscreen key is inactive; and
a plurality of probe light sources each configured to emitting a consubstantial light emission, and
a plurality of probe light sensors disposed within the casing behind the LC layer, such that each touchscreen key of the plurality is matched up with a corresponding probe light source and with a probe light sensor,
wherein user contact with a particular touchscreen key of the plurality is detected when the corresponding light source transmits a probe light and the corresponding probe light sensor senses a reflection of the probe light from the corresponding partition of the touchscreen surface.

18. The LCD device of claim 17, wherein the LC layer partitions are configured to provide the probe light opening to the touchscreen keys according to a timesharing scheme during touchscreen mode.

19. The LCD device of claim 17, wherein, during touchscreen mode, each probe signal source is selectively turned on when the corresponding touchscreen key is active and turned off when the corresponding touchscreen key is inactive.

20. The LCD device of claim 17, wherein user contact with a particular touchscreen key is detected when a measured intensity at the corresponding probe light sensor exceeds a predetermined threshold while the touchscreen key is active.

* * * * *